United States Patent [19]
Kitamura

[11] 4,061,816
[45] Dec. 6, 1977

[54] INTEGRALLY SINTERED CERAMIC COMPLEX AND METHOD OF MANUFACTURING THE SAME

[75] Inventor: Tomosaburo Kitamura, Kawasaki, Japan

[73] Assignee: Sony Corporation, Tokyo, Japan

[21] Appl. No.: 669,516

[22] Filed: Mar. 23, 1976

[30] Foreign Application Priority Data

Apr. 1, 1975 Japan .................................. 50-40151

[51] Int. Cl.$^2$ ........................ B32B 7/02; C04B 35/00; C04B 35/46
[52] U.S. Cl. .................... 428/218; 106/73.3; 252/62.9; 428/325; 428/539
[58] Field of Search ........................ 106/73.3, DIG. 5; 252/62.9, 62.9 R, 62.9; 428/218, 219, 325, 340, 341, 539

[56] References Cited

U.S. PATENT DOCUMENTS

| 3,661,781 | 5/1972 | Ichinose et al. | 252/62.9 |
| 3,663,440 | 5/1972 | Thomann | 252/62.9 |
| 3,712,846 | 1/1973 | Daniels et al. | 428/218 X |
| 3,713,877 | 1/1973 | Kirchner et al. | 428/218 |
| 3,911,188 | 10/1975 | Torti et al. | 428/539 X |
| 3,923,675 | 12/1975 | Mazdiyashi et al. | 106/73.3 X |
| 3,926,702 | 12/1975 | Oki et al. | 428/218 X |

Primary Examiner—Thomas J. Herbert, Jr.
Assistant Examiner—R. Eugene Varndell, Jr.
Attorney, Agent, or Firm—Hill, Gross, Simpson, Van Santen, Steadman, Chiara & Simpson

[57] ABSTRACT

An integrally sintered ceramic complex which is suitable for use as a substrate of a surface acoustic wave device and can effectively reduce unnecessary ultrasonic waves.

The method of manufacturing the integrally sintered ceramic complex is also disclosed.

The disclosed ceramic complex comprises a first ceramic portion made of densely sintered piezoelectric ceramic material and a second ceramic portion made of porously sintered ceramic material. Both the ceramic portions are sintered integrally, and the second portion surrounds the first portion.

The operating area of the surface acoustic wave device is formed on the surface of the first ceramic portion.

9 Claims, 13 Drawing Figures

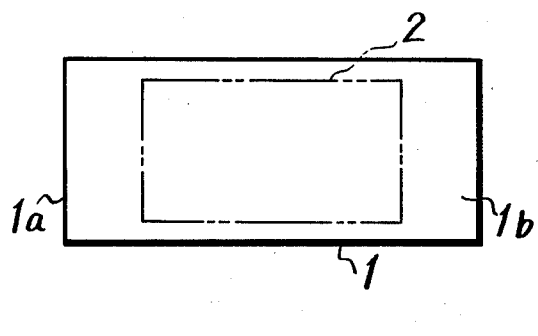
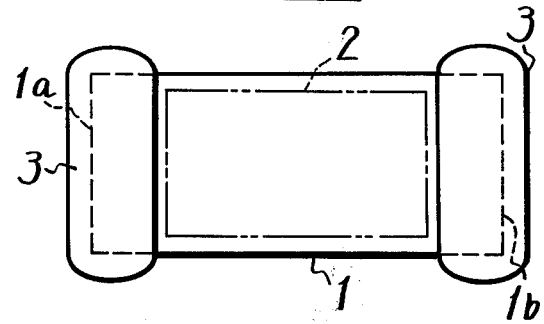
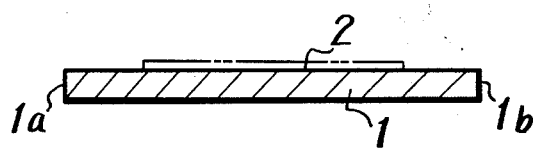
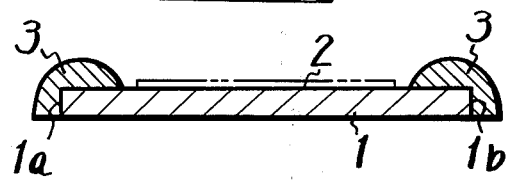
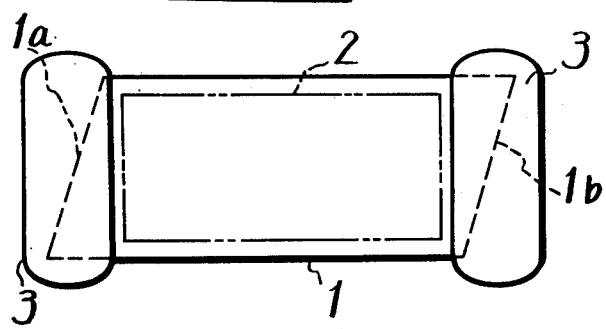
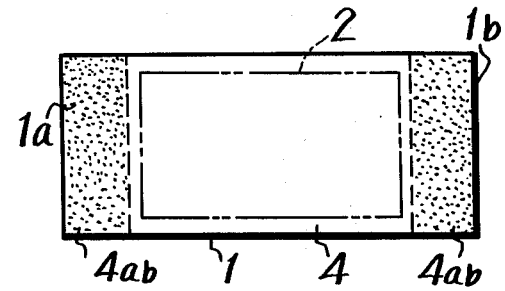
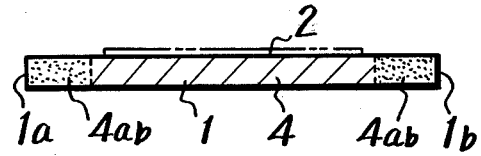
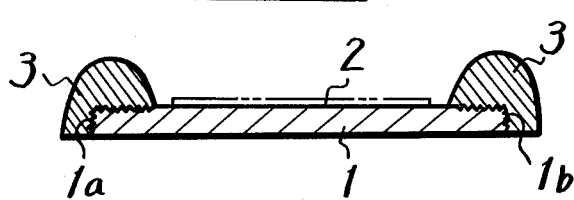
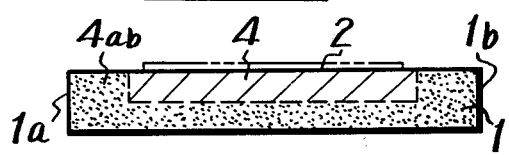

INTEGRALLY SINTERED CERAMIC COMPLEX AND METHOD OF MANUFACTURING THE SAME

BACKGROUND OF THE INVENTION

1. Field of the Invention

The present invention relates generally to an integrally sintered ceramic complex and a method of manufacturing the same, which ceramic complex is suitable for use as a substrate of a surface acoustic wave device.

2. Description of the Prior Art

In general, a surface acoustic wave device is used as a filter device or delay line and the distance between input and output transducers thereof is selected in accordance with a desired delay time.

An ordinary surface acoustic wave divice is formed in such a manner that input and output transducers consisting of, for example, a pair of interdigital electrodes are mounted on the major surface of a piezoelectric substrate, which is made of ceramic and serving as a surface acoustic wave propagation medium, with a predetermined distance therebetween.

With such a prior art surface acoustic wave device, a surface acoustic wave generated at the input transducer arrives at the output transducer through the propagation medium and then is derived as an output signal from the latter. In this case, however, a part of the surface acoustic wave propagates beyond the output transducer to the end of the propagation medium, is then reflected thereon, returned to the output transducer and then derived as an output signal therefrom. Therefore, the frequency characteristics of the surface acoustic wave device is affected by the reflected acoustic wave or undesired acoustic wave to have a curve with ripples in its pass band. Therefore, in practice it is necessary to reduce or attenuate the undesired acoustic wave components as much as possible.

As a method to reduce the undesired wave components there has been proposed such a treatment that, on the both end portions of a surface acoustic ultrasonic wave propagation medium such as a piezoelectric substrate in its surface acoustic (ultrasonic) wave propagation direction, there are provided ultrasonic wave absorbing members made of such as polyurethane.

As another method of reducing the undesired reflected wave components, there has been also proposed to roughen both the end portions of the piezoelectric substrate, or to cut both the ends of the piezoelectric substrate obliquely with respect to the surface acoustic wave propagation direction so as to prevent the reflected wave on the both ends from being propagated reciprocally.

However, with any of the prior art methods it is rather complicated to work the piezoelectric substrate for reducing the undesired wave components, and also when some of the methods are combined so as to greatly reduce the undesired wave component, it becomes much complicated to manufacture such a piezoelectric substrate.

OBJECTS AND SUMMARY OF THE INVENTION

It is an object of the present invention to provide an integrally sintered ceramic complex which can effectively reduce unnecessary ultra sonic waves when it is used as a piezoelectric substrate of a surface acoustic wave device or the like.

It is another object of the present invention to provide an integrally sintered ceramic complex which is suitable for use as a surface acoustic wave device.

It is a further object of the present invention to provide a method of manufacturing a ceramic complex which can effectively reduce the reflection of ultrasonic waves when it is used as a piezoelectric substrate of a surface acoustic wave device or the like.

According to an aspect of the present invention there is provided a ceramic complex which comprises a densely sintered piezoelectric ceramic portion and a porously sintered ceramic portion, in which the both portions are sintered integrally. The porosity of the ceramic complex is changed gradually through the boundary between the densely sintered ceramic portion and the porously sintered ceramic portion so that unnecessary ultra sonic waves are effectively reduced when the ceramic complex is used as a surface acoustic wave device or the like.

The additional and other objects, features and advantages of the present invention will become apparent from the following description taken is conjunction with the accompanying drawings.

BRIEF DESCRIPTION OF THE DRAWINGS

FIG. 1 is a top plan view of a prior art surface acoustic wave device;

FIG. 2 is its cross-sectional view;

FIG. 4 is a top plan view of another prior art surface acoustic wave device;

FIG. 5 is a its cross-sectional view;

FIG. 7 is a top plan view of a further prior art surface acoustic wave device;

FIG. 8 is its cross-sectional view;

FIG. 10 is a top plan view of a surface acoustic wave device which is made of an example of the integrally sintered ceramic complex according to the present invention;

FIG. 11 is its cross-sectional view;

FIG. 13 is a cross-sectional view showing a surface acoustic wave device which is made of another example of the integrally sintered ceramic complex of the invention.

DESCRIPTION OF THE PREFERRED EMBODIMENTS

Figure 3:
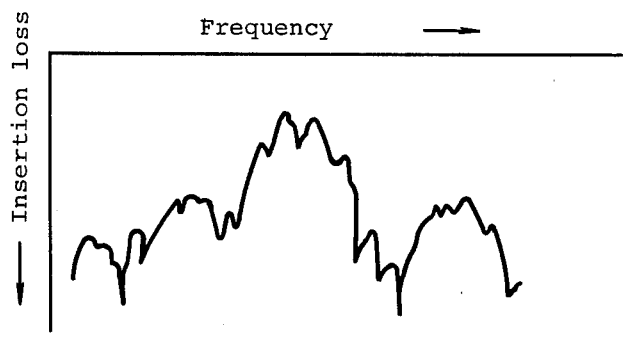
FIG. 3 is a graph showing the frequency characteristics of the surface acoustic wave device shown in FIGS. 1 and 2.

An integrally sintered ceramic complex according to the present invention, which can prevent the generation of unnecessary reflection of ultrasonic waves and so on when it is used as a surface acoustic (ultrasonic) wave device, is simple in construction, easy to manufacture and suitable for mass production, and its manufacturing method will be hereinafter described.

An example of the ceramic complex according to the present invention includes a densely sintered ceramic portion and a porously sintered ceramic portion as compared with the former which are sintered integrally to form an ultrasonic propagation path or operating part from the densely sintered ceramic portion and a reflection preventing member from the porously sintered portion for absorbing or scattering the ultrasonic wave.

With reference to FIGS. 10 and 11, an example of the ceramic complex according to the present invention, which is used as a surface acoustic wave device (surface acoustic wave filter), will be now described.

The surface acoustic wave device shown in FIGS. 10 and 11 is formed such that the ceramic complex of the present invention is used as a piezoelectric substrate 1. The piezoelectric substrate 1 consists of an operating portion 2, which is made of a first ceramic material 4, serves as ultrasonic wave propagation path and on which input and output transducers made of interdigital electrodes (not shown) are formed, and end portions $1a$ and $1b$, which are made of a second ceramic material $4ab$ and located adjacent the both side ends of the operating portion 2.

The first and second ceramic materials 4 and $4ab$ are made materials different in ceramic composition. The ratio $\delta$ between the theoretical density (or X-ray density) $D_L$ and the practical sintered density (or fired density) $D_S$ or $D_L/D_S$ of the respective ceramic materials is selected such that the ratio $\delta_A$ of the first ceramic material 4 is smaller than that $\delta_B$ of the second ceramic material $4ab$. In other words, the second ceramic material $4ab$ forming both the end portions $1a$ and $1b$ is selected more porous as compared with the first ceramic material 4 forming the operating portion 2, and hence ultrasonic waves are absorbed more in the both end portions $1a$ and $1b$ as compared in the operating portion 2.

The above mentioned theoretical density $D_L$ is obtained crystalographycally and theoretically, and the above mentioned sintered density $D_S$ represents the density of the material after it has been practically sintered. In this case, as the ratio $D_L/D_S$ is closer to 1, the material is more dense, while as the ratio $D_L/D_S$ is greater than 1, the material is more porous.

The ceramic materials forming the both materials 4 and $4ab$ are made of materials which can be sintered with each other. That is, the main components of both the materials are selected from a common material thereto or atoms which will form their main components and will be diffused with each other. Thus, when both the materials are sintered together or integral, they are diffused with each other through the boundary therebetween to prevent their physical property being changed abruptly on the boundary but to change their physical property gradually through the boundary, or the sintered ceramic material $4ab$ increases its density property as it approaches the ceramic material 4 or the boundary but the sintered ceramic material 4 increases its porousity as it approaches the ceramic material $4ab$. Therefore, an acoustic wave passed through the output transducer (not shown) on the operating portion 2 is prevented from being reflected on the boundary between the materials 4 and $4ab$ but is absorbed or scattered by the material $4ab$. As a result, unnecessary acoustic waves are reduced.

Next, an example of the method of manufacturing the ceramic complex for preventing the reflection of an ultrasonic wave, which consists of the first and second ceramic materials 4 and $4ab$, according to the present invention will be now described.

The first and second ceramic materials 4 and $4ab$ are made of respective ceramic materials as a predetermined shape, for example, a plate by a press-molding, respectively, and then they are sintered. In this case, as described previously, the ratio between the theoretical density $D_L$ and sintered density $D_S$ or $D_L/D_S$ of the ceramic material for the material 4 is selected smaller than that $D_L/D_S$ of the ceramic material for the material $4ab$, and in addition thereto both the materials 4 and $4ab$ are so selected that the optimum sintering temperature $T_A$ of the material 4 is lower than that $T_B$ of the material $4ab$. The above optimum sintering temperature means such that a sintering temperature that the proper characteristics of the ceramic composition thereof is not damaged and its theoretical density or approximately the same density can be obtained.

As a material suitable for the first ceramic material 4, a material of $Pb(Cd_{2/5}Nb_{2/5}W_{1/5})x$ $Ti_y$ $ZrzO_3$, where $x = 0.01-0.2$, $y = 0.20-0.94$, $z = 0.01-0.74$, and 0.2-1.0 weight percent of $MnO_2$ added thereto can be exemplified. This material is superior in piezoelectricity and sintering property and its optimum sintering temperature is relatively low.

In this case, the raw materials as the first and second ceramic materials 4 and $4ab$ are calcined and then ground. However, it is also possible that the material, which is obtained by calcining the raw material and then grinding the calcined material, is used as the first ceramic material 4, but a non-calcined material is used as the second ceramic material $4ab$. In this latter case, the respective materials are press-molded to be of a predetermined shape and the press-molded materials are sintered at the optimum sintering temperature of the first ceramic material 4, by which the ratio $D_L/D_S$ of the theoretical and sintered densities of the respective materials can be selected such that the ratio $D_L/D_S$ of the first ceramic material 4 is greater than that $D_L/D_S$ of the second ceramic material $4ab$.

It is also possible that the grain sizes of the ceramic materials, which are calcined and then ground and which are used as the first and second ceramic materials, are selected such that the grain size of the second material is greater than that of the first ceramic material, and the materials are pressed to be of a predetermined shape and then sintered to form the ceramic complex.

EXAMPLE 1

As the first ceramic material 4, a first composition composed of $Pb(Cd_{2/5}Nb_{2/5}W_{1/5})_{0.05}Ti_{0.525}Zr_{0.425}O_3$ whose optimum sintering temperature is 1000° C and whose theoretical density $D_L$ is 8.1 gr/cm³ and 0.5 weight percent of $MnO_2$ is employed, while as the second ceramic material $4ab$, a second composition made of $Pb_{0.91}La_{0.09}Ti_{0.35}Zr_{0.65}O_3$ whose optimum sintering temperature is 1250° C and whose theoretical density $D_L$ is 8.1 gr/cm³, is used. Both the compositions are calcined at the temperature of 800°-900° C and then ground to be smaller than 1 micron in grain size, respectively. Thus obtained particles are press-molded as a plate. That is, the center portion of the press-molded plate is formed of the first composition and its both side portions are formed of the second composition. In this case, these portions are molded integrally with one another. Thereafter, the press-molded plate is sintered at the optimum sintering temperature of the first composition or 1000° C lower than the optimum sintering temperature of the second composition. Thus, an example of the ceramic complex according to the present invention is made which consists of the first ceramic portion made of the first ceramic material 4 positioned at the center thereof and the second ceramic portions made the second ceramic material 4ab positioned at the both sides of the first ceramic portion.

With the ceramic complex of the invention thus made, the sintered density at the first ceramic portion 4 of the ceramic complex is 8.0 gr/cm³ approximately same as its theoretical density and the sintered density at the second ceramic portions 4ab of the ceramic complex is 6.6 gr/cm³ rather lower than its theoretical density 8.1 gr/cm³. That is, the ratios of the theoretical density and sintered density of the respective ceramic portions 4 and 4ab of the ceramic complex of the invention thus made is $\delta_A < \delta_B$. Further, the boundary between the ceramic potions 4 and 4ab of the ceramic complex is such that since the main component of the first and second compositions is common with each other, mutual diffusion of the respective components takes place through the boundary when they are sintered. Hence, the physical property of the ceramic complex is varied gradually therethrough.

By way of example, when the ceramic complex of the above Example 1 is used as the piezoelectric substrate 1 shown in FIGS. 10 and 11, one of its surface is mirror-polished, and then input and output transducers consisting of a pair of interdigital electrodes (not shown) are formed on the mirror-polished surface of the piezoelectric substrate 1 with a predetermined distance. In this case, the lengthwise direction of the substrate 1 shown in FIG. 10 is selected as the surface acoustic wave propagation direction. The frequency characteristics of the surface acoustic wave device using the ceramic complex of the Example 1 described above are shown in the graph of FIG. 12 in which the abscissa represents the frequency and the ordinate represents the insertion loss. From the graph of FIG. 12, it will be apparent that the affect by unnecessary reflection wave components is avoided effectively by the employment of the ceramic complex according to the present invention. This is caused by the fact that the second ceramic portions 4ab at the both sides of the first ceramic portion 4, which forms the operating portion 2, has the porous property as compared with the first ceramic portion 4 to absorb an ultrasonic wave arriving thereat or to scatter the ultrasonic wave thereby. Further, the characteristics or properties of the ceramic complex are continuously or gradually changed through the boundary between the portions 4 and 4ab, so that the ultrasonic wave is not reflected on the boundary and is absorbed or scattered by the portions 4ab with the result that unnecessry waves or ultrasonic waves once passed through the output transducer hardly arrive at the output transducer again.

In this case, it is possible that an ultrasonic wave absorbing agent such as pitch, oil, plastics or the like is immersed in the porous material portions 4ab to enhance its ultrasonic wave absorbency efficiency.

The above description is given for the example in which the ceramic complex or piezoelectric substrate 1 consists of the first ceramic portion 4 positioned at the center and the second ceramic portions 4ab located at the both sides of the first ceramic portion 4, but such a construction shown in FIG. 13 can be possible in which the first ceramic portion 4 forming the operating portion 2 is located center and the second ceramic portion 4ab is located in such a manner that it surrounds the lower surface and both sides of the first ceramic portion 4. With this example, not only the unnecessary surface wave but also unnecessary bulk waves can be eliminated. That is, the construction of the ceramic complex of the present invention can be varied in accordance with objects and conditions to be used.

The technical advantages, effects and so on of the surface acoustic wave device using the ceramic complex of the present invention will become apparent from the following comparisons of the invention with the prior art examples.

Figure 6:
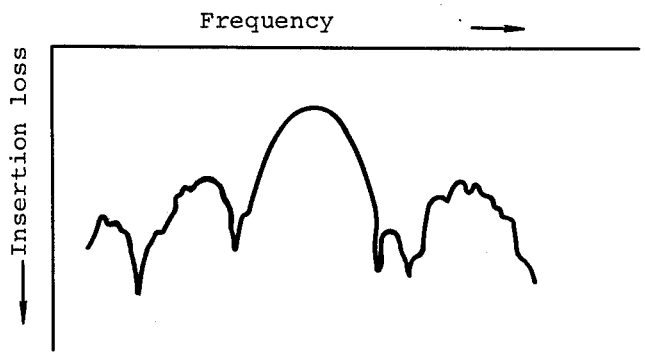
FIG. 6 is a graph showing the frequency characteristics of the surface acoustic wave device shown in FIGS. 4 and 5.

The frequency characteristics of a prior art surface acoustic wave filter shown in FIGS. 1 and 2, which uses a piezoelectric substrate 1 with no special treatment is, shown in the graph of FIG. 3, and the frequency characteristics of another prior art surface acoustic wave filter shown in FIGS. 4 and 5, which uses a piezoelectric substrate 1 with ultrasonic wave absorbing members 3 made of such as polyurethane at the both end portions 1a and 1b of the substrate 1 in its surface wave propagation direction, is shown in the graph of FIG. 6. As may be apparent from the graphs of FIGS. 3 and 6, both the frequency characteristics of the prior art surface acoustic wave filters shown in FIGS. 1, 2 and 4, 5 are affected by the unnecessary acoustic waves and hence not preferred.

Figure 9:
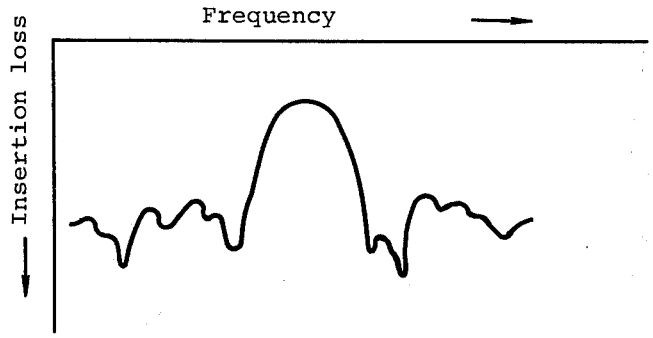
FIG. 9 is a graph showing the frequency characteristics of the surface acoustic wave device shown in FIGS. 7 and 8.

The frequency characteristics of a further prior art surface acousic wave filter shown in FIGS. 7 and 8, which uses a piezeoelectric substrate 1 whose both end portions 1a and 1b in the surface acoustic wave propagation direction are cut obliquely, whose end surface and the surface forming other than the operating portion 2 are roughened and whose end portions 1a and 1b are provided with the ultrasonic wave absorbing members 3 made of such as polyurethane, is shown in the graph of FIG. 9. It is also apparent that the frequency characteristics of this prior art example is similarly affected by the unnecessary acoustic waves from the graph of FIG. 9.

Figure 12:
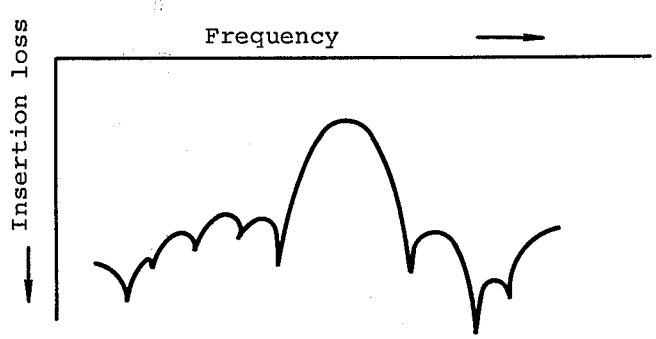
FIG. 12 is a graph showing the frequency characteristics of the surface acoustic wave device shown in FIGS. 10 and 11.

Therefore, if the frequency characteristis of the surface acoustic wave filter shown in FIG. 12, which filter employs the ceramic complex of the present invention as shown in FIGS. 10, 11 or 13, are compared with the frequency characteristics of the prior art surface acoustic wave filters shown in FIGS. 3, 6 and 9, the filter using the ceramic complex of the invention can eliminate the affects by the unnecessary acoustic waves effectively.

EXAMPLE 2

As a first ceramic composition forming the first ceramic material 4, the composition similar to that used in the Example 1 is employed, and as a second ceramic composition forming the second ceramic material 4ab, a composition material of $Pb(Cd_{2/5}Nb_{2/5}W_{1/5})_{0.05}Ti_{0.525}Zr_{0.425}O_3$, whose optimum sintering temperature is 1100° C and whose theoretical density is 8.1 gr/cm³, is employed in non-calcined raw powders. Both the ceramic compositions are press-molded and then sintered at the temperature of 1000° CC similar to the Example 1. At this time, the sintered density of the second ceramic material 4ab becomes 7.0 gr/cm³.

EXAMPLE 3

As a first ceramic composition forming the first ceramic material 4, the composition same as that used in the Example 1 is employed, and as a second ceramic composition forming the second ceramic material 4ab, a composition of $Pb(Zr_{0.5}Ti_{0.5})O_3$, whose optimum sintering temperature is 1250° C and whose theoretical density is 8.1 gr/cm³ is employed. Both the ceramic compositions are press-molded and then sintered at the temperature of 1000° C in a manner similar to the Example 1. At this time, the sintered density of the second ceramic material 4ab becomes 6.5 gr/cm³.

EXAMPLE 4

The ceramic compositions similar to those of the Example 1 and the treating method similar to that of Example 1 are employed. In this case, the first ceramic composition is ground as powders whose grain size is selected smaller than 1 micron but the second ceramic composition is ground as powders which are selected in grain size not to pass through a mesh of the standard mesh size of 200 or whose grain size is selected more than 10 microns. At this tiime, the sintered density of the second ceramic portions 4ab is 6.9 gr/cm³.

It is ascertained that when the ceramic complexes of the Examples 2 to 4 are used as a surface acoustic wave device, they can avoid the influences by unnecessary acoustic waves effectively.

The above description is given on the case where the ceramic complex of the present invention is used as the surface acoustic wave device, but it will be apparent that the ceramic complex of the invention can be used as a device for transmitting a bulk wave with the similar effects.

It will be apparent that many modifications and variations could be effected by one skilled in the art without departing from the spirits or scope of the novel concepts of the present invention.

I claim as my invention:

1. An integrally sintered ceramic complex, comprising: a first piezoelectric ceramic portion; and a second ceramic portion; said first and second portions having a common external surface, said first and second ceramic portions being sintered integrally so that a boundary layer is formed between said first and second portions, the ratio of the theoretical density to the sintered density of said first ceramic portion being selected smaller than the same ratio of said second ceramic portion, and the ratio of the theoretical density to the sintered density in the boundary layer gradually increased from the ratio of said first portion to the ratio of said second portion so that ultrasonic waves propagating in said first piezoelectric portion are effectively reduced in the boundary layer and said second portion.

2. An integrally sintered ceramic complex according to claim 1 where said first ceramic portion is $Pb(Cd_{2/5} Nb_{2/5} W_{1/5})x\ Ti_y\ Zr_zO_3$, where $x$ is in the range of 0.01 to 0.2, $y$ is in the range of 0.20 to 0.94 and $z$ is in the range of 0.01 to 0.74.

3. An integrally sintered ceramic comlex according to claim 2 wherein 0.2 to 1.0 weight percent of $MnO_2$ is added to said first ceramic portion.

4. An integrally sintered complex according to claim 3 wherein said ceramic portion is $Pb_{0.91}$, $La_{0.09}\ Ti_{0.35}\ Zr_{0.65}\ O_3$.

5. An integrally sintered complex according to claim 3 wherein said second ceramic portion is $Pb\ (Cd_{2/5} Nb_{2/5}\ W_{1/5})_{0.05}\ Ti_{0.525}\ Zr_{0.425}\ O_3$.

6. An integrally sintered complex according to claim 3 wherein said second ceramic portion is $Pb\ (Zr_{0.5}\ Ti_{0.5})O_3$.

7. An integrally sintered ceramic complex as claimed in claim 1, in which the ceramic materials of said first and the second ceramic portions contain as their main element materials which can be diffused with each other through the boundary between said first and the second ceramic portions.

8. An integrally sintered ceramic complex as claimed in claim 1, in which said first portion is surrounded by said second ceramic portion.

9. An integrally sintered ceramic complex as claimed in claim 1, in which said second portion is positioned at both sides of said first portion.

* * * * *